(12) United States Patent
Wasserman et al.

(10) Patent No.: US 10,021,534 B2
(45) Date of Patent: Jul. 10, 2018

(54) METHOD FOR INCREASING MULTICAST THROUGHPUT IN A SINGLE-HOP MULTI-CHANNEL WIRELESS NETWORK

(71) Applicant: SPAWAR Systems Center Pacific, San Diego, CA (US)

(72) Inventors: David Robert Wasserman, San Diego, CA (US); Douglas S. Hulbert, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 367 days.

(21) Appl. No.: 14/876,469

(22) Filed: Oct. 6, 2015

(65) Prior Publication Data

US 2017/0099585 A1   Apr. 6, 2017

(51) Int. Cl.
| | |
|---|---|
| *H04W 4/06* | (2009.01) |
| *H04L 5/14* | (2006.01) |
| *H04W 72/12* | (2009.01) |
| *H04L 12/18* | (2006.01) |

(52) U.S. Cl.
CPC ............. *H04W 4/06* (2013.01); *H04L 5/14* (2013.01); *H04L 12/1886* (2013.01); *H04W 72/12* (2013.01); *H04L 12/189* (2013.01)

(58) Field of Classification Search
CPC ....................................................... H04W 4/06
See application file for complete search history.

(56) References Cited

U.S. PATENT DOCUMENTS

| | | | |
|---|---|---|---|
| 2013/0107764 A1* | 5/2013 | Zeger | H04L 5/16 370/280 |
| 2015/0229484 A1* | 8/2015 | Lim | H04L 12/1863 370/390 |

OTHER PUBLICATIONS

U. C. Kozat, "On the Throughput Capacity of Opportunistic Multicasting with Erasure Codes," IEEE INFOCOM 2008—The 27th Conference on Computer Communications, Phoenix, AZ, 2008, pp. doi: 10.1109/INFOCOM.2008.100.*
David R. Wasserman and Douglas S. Hulbert; Maximizing Multicast Throughput in a Single-Hop Multi-Channel Wireless Network; 2014 IEEE Military Communications Conference; pp. 1207-1212; Date of Conference Oct. 6-8, 2014.
A. Rezaee, L. Zeger, and M. Médard, "Multi-Packet Reception and Network Coding," in MILCOM, pp. 1393-1398, 2010.

(Continued)

*Primary Examiner* — Jeffrey M Rutkowski
*Assistant Examiner* — Chae S Lee
(74) *Attorney, Agent, or Firm* — SPAWAR Systems Center Pacific; Kyle Eppele; J. Eric Anderson

(57) ABSTRACT

A communications method comprising the following steps: establishing a single-hop, multi-channel wireless network comprising a plurality of half-duplex nodes that can simultaneously receive on multiple channels but that cannot simultaneously transmit on the multiple channels; using linear programming to establish a rapid-throughput transmission schedule for data transmissions between the half-duplex nodes; multicasting all the data transmissions in the network in multicast sessions according to the transmission schedule; using erasure coding to reconstruct data transmitted in a particular multicast session in instances where the entirety of the particular multicast session is not received at a given node because the given node was transmitting during part of the particular multicast session.

16 Claims, 3 Drawing Sheets

(56) References Cited

OTHER PUBLICATIONS

S. Kompella, J. E. Wieselthier, A. Ephremides, H. D. Sherali, and G. D. Nguyen, "On optimal SINR-based scheduling in multihop wireless networks," IEEE/ACM Trans. Netw., vol. 18, No. 6, pp. 1713-1724, Dec. 2010.

* cited by examiner

METHOD FOR INCREASING MULTICAST THROUGHPUT IN A SINGLE-HOP MULTI-CHANNEL WIRELESS NETWORK

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 102743.

BACKGROUND OF THE INVENTION

In a wireless, multichannel network of half-duplex nodes, the nodes cannot simultaneously transmit and receive. Thus, if a particular node is the source of one message and a recipient of another message, in order for both messages to be successfully received those two messages could not overlap in time. This restriction limits throughput. There exists a need for a better way to communicate in a wireless, multichannel network of half-duplex nodes.

SUMMARY

Disclosed herein is a communications method comprising the following steps. The first step provides for establishing a single-hop, multi-channel wireless network comprising a plurality of half-duplex nodes in which each node can simultaneously receive on multiple channels but within which an individual node cannot simultaneously transmit and receive. The next step provides for using linear programming to establish a rapid-throughput transmission schedule for data transmissions between the half-duplex nodes. The next step provides for multicasting all the data transmissions in the network in multicast sessions according to the transmission schedule. The next step provides for using erasure coding to reconstruct data transmitted in a particular multicast session in instances where the entirety of the particular multicast session is not received at a given node because the given node was transmitting during part of the particular multicast session.

The communications method disclosed herein may be implemented on a single-hop, multi-channel wireless network comprising a plurality of half-duplex nodes and a processor/controller. The plurality of half-duplex nodes are all positioned within wireless communication range of each other. The nodes are positioned and connected such that they can simultaneously receive multicast sessions on multiple channels. The nodes cannot simultaneously transmit on multiple channels. The processor is operatively coupled to the nodes and configured to use linear programming to establish a rapid-throughput transmission schedule for data transmissions between the half-duplex nodes such that all data transmissions between the nodes are conducted according to the transmission schedule. Each node is configured to use erasure coding to reconstruct data transmitted in a particular multicast session in instances where the entirety of the particular multicast session is not received at a given node because the given node was transmitting during the particular multicast session.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
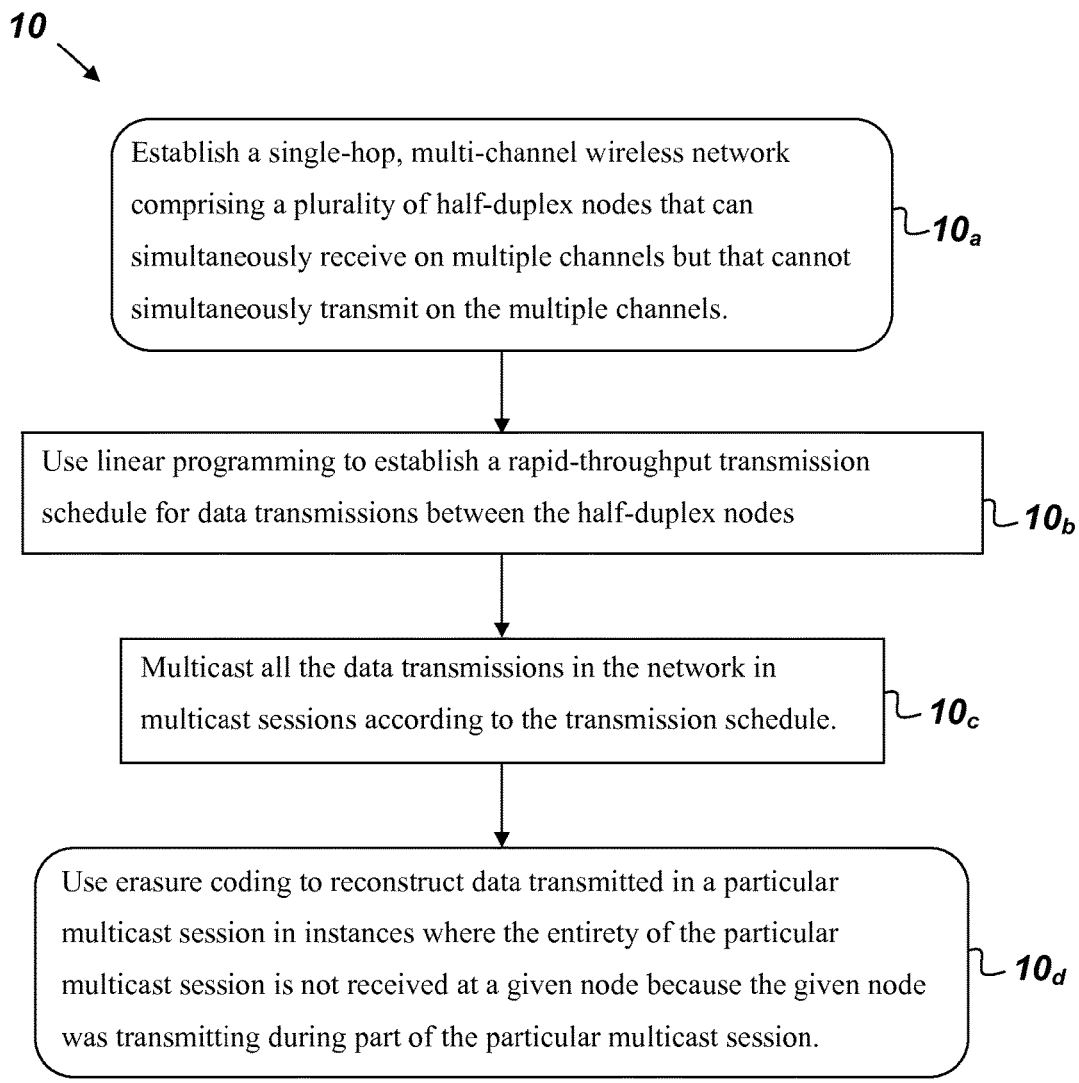
FIG. 1 is a flowchart of a communications method.

FIG. 1 is a flowchart of a method for increasing multicast throughput in a single-hop multi-channel wireless network (hereinafter referred to as method 10). Method 10 comprises, consists of, or consists essentially of the following steps. The first step $10_a$ provides for establishing a single-hop, multi-channel wireless network comprising a plurality of half-duplex nodes that can simultaneously receive on multiple channels but that cannot simultaneously transmit on multiple channels, and cannot simultaneously transmit and receive. An individual node cannot simultaneously transmit on more than one channel, nor can an individual node transmit and receive simultaneously. The next step $10_b$ provides for using linear programming to establish a rapid-throughput transmission schedule for data transmissions between the half-duplex nodes. The next step $10_c$ provides for multicasting all the data transmissions in the network in multicast sessions according to the transmission schedule. The next step $10_d$ provides for using erasure coding to reconstruct data transmitted in a particular multicast session in instances where the entirety of the particular multicast session is not received at a given node because the given node was transmitting during part of the particular multicast session.

Figure 2:
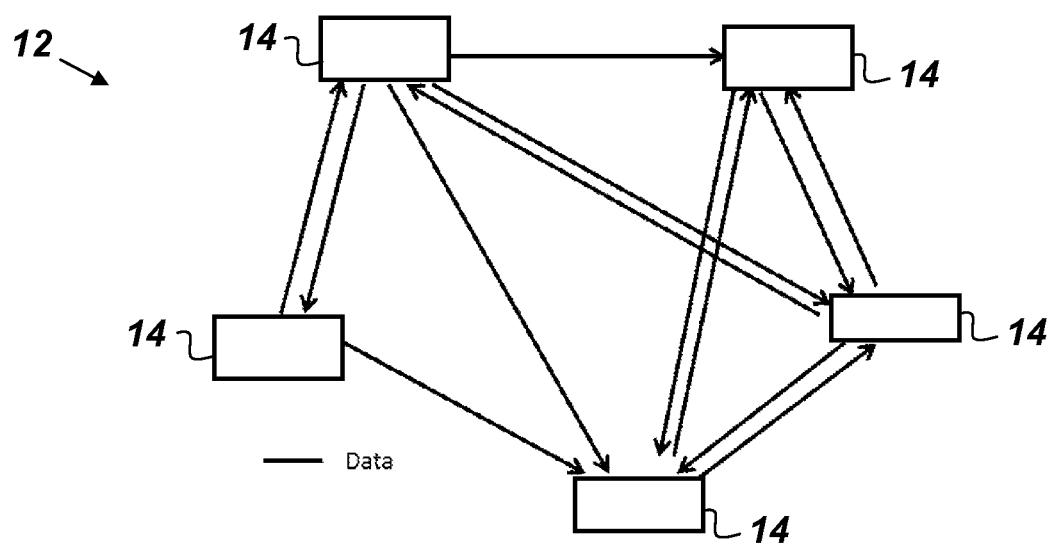
FIG. 2 is an illustration of a wireless network.

FIG. 2 is an illustration of an embodiment of a wireless network 12. Wireless network 12 comprises, consists of, or consists essentially of a plurality of half-duplex nodes 14. All nodes 14 are within communication range of each other and share multiple independent channels. The nodes 14 in this network 12 may be any digital, half-duplex data link that cannot simultaneously transmit and receive, but can only transmit on one channel at a time, and when not transmitting it can simultaneously receive all channels. A suitable example of a node 14 includes, but is not limited to, a Link-16 radio equipped with Concurrent Multi-Netting (CMN) capability allowing it to receive on multiple nets (frequency hopping sequences that serve as virtual channels) simultaneously. Increased throughput may be achieved through the use of erasure coding, which eliminates the requirement that all recipient nodes 14 listen at the same time. For any given set of multicast sessions, throughput may be increased subject to a fairness constraint through linear programming.

Figure 3:
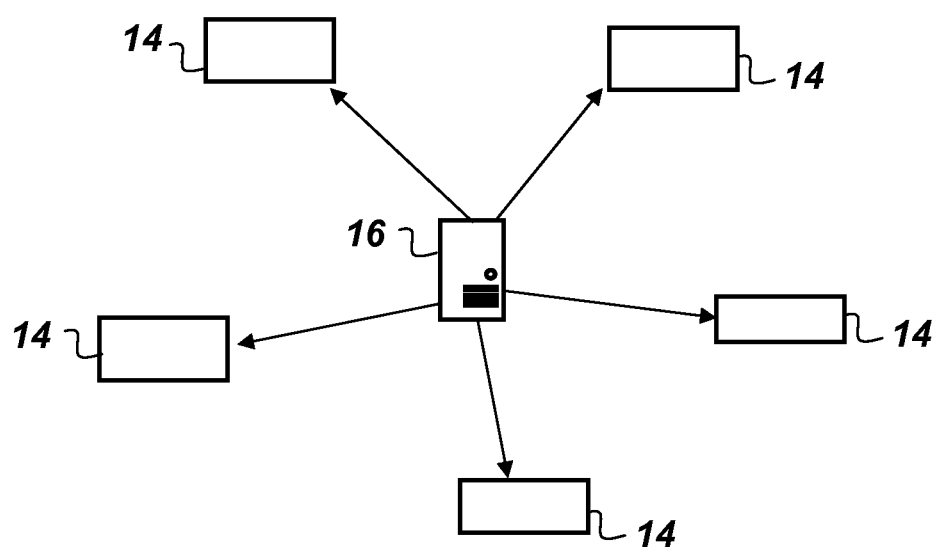
FIG. 3 is an illustration of a controller connected to network nodes.

FIG. 3 is an illustration of a controller 16 uploading the transmission schedule to all of the nodes 14. The controller 16 may be any computer/processor capable of establishing a rapid-throughput transmission schedule for data transmissions between the half-duplex nodes 14. Suitable examples of the controller 16 include, but are not limited to, a Dell® Inspiron® computer and an HP® Slimline computer. The nodes 14 may be stationary or mobile. The controller 16 may be connected to the nodes either wirelessly or with a wired connection. The controller 16 is operatively coupled to the nodes and configured to use linear programming to establish a rapid-throughput transmission schedule for data transmissions between the half-duplex nodes 14 such that all data transmissions between the nodes 14 are conducted according to the transmission schedule. Each node is configured to use erasure coding to encode and decode data transmitted in a particular multicast session in instances where the entirety of the particular multicast session is not received at a given node 14 because the given node 14 was transmitting during the particular multicast session.

A single-hop wireless network that was originally designed to use a single channel, may be later modified to use multiple statistically independent channels. Each node 14 is half-duplex, i.e. it cannot simultaneously transmit and receive. Each node 14 can only transmit on one channel at a time, but when not transmitting it can simultaneously receive all channels. Such nodes behave similarly to nodes with F-multi-packet reception (MPR), where F is the number of channels. All traffic in the network is multicast.

Instead of scheduling transmissions so that all recipients of a multicast are listening at the same time for the duration of the transmission, method 10 uses erasure coding, which eliminates the requirement that all recipients listen at the same time. Method 10 also uses linear programming (LP) to increase the throughput for any given set of multicast sessions subject to a fairness constraint.

In a specific, example embodiment of method 10, the nodes 14 are enhanced Link-16 network platforms that are programmed by the controller 16 ahead of an operational task. The nodes 14 do not need to be connected to the controller 16 during performance of the operational task. During the operational task the nodes 14 perform their communication tasks and in addition, erasure coding and erasure decoding. In this embodiment, the Linear Programming part of method 10 is completed by the controller 16 before the nodes 14 begin their operational task and the erasure coding schemes are loaded into the software of the Link-16 units before the operational task begins. Then, during the task, each node 14 (in this case a Link-16 Mission Computer) performs erasure encoding on its outgoing messages and erasure decoding on it incoming messages. All the coding and decoding works because all participating nodes 14 received the transmission schedule from the controller 16 before the operational task began. The nodes 14 may have a synchronized start time for each run of a message exchange sequence and they need not be connected to the controller 16 at all times. In this embodiment, the controller 16 lives offline and works up the transmission schedule and chooses n and k to implement the right erasure code to process a given set of messages, where each message consists of a number of bits and the identities of the message recipients. Once each node 14 knows the schedule and the parameters of the erasure code for each message, then each node 14 can run its coding and decoding steps without additional information from the controller 16 until it finishes its operational task and is then reconnected to the controller 16.

A node 14 generally has multiple interfaces, enabling it to simultaneously receive on multiple channels, but the nodes 14 used in method 10 have an asymmetrical constraint that the nodes cannot simultaneously transmit on multiple channels. Nodes with MPR are the best approximation to this constraint. In an embodiment of method 10, retransmission of a multicast session is not allowed and the transmission schedule is built with the assumption that each transmitter node has a reliable channel to all of its recipient nodes, and erasure coding is only used in instances where given nodes could not receive the entire transmission because the given nodes were transmitting on another channel at the time of the transmission.

The following is a description of an example embodiment of the method 10 where the network 12 has the following characteristics:

1. The nodes share multiple statistically independent channels; let F be the number of channels.
2. A node can transmit on only one channel at a time, and cannot listen while transmitting.
3. When not transmitting, a node can listen to all F channels.
4. All nodes are within communication range of each other, so on each channel only one node may transmit at a time.
5. If only one node is transmitting on a particular channel, and the transmission rate is ≤c bits per second, all listening nodes can receive this transmission error-free.

Further, hardware and software may limit the behavior of the nodes. This embodiment of method 10 also includes the following restrictions:

1. All transmissions are required to be at the same rate of c bits per second.
2. Messages will not be relayed.

The transmission schedule may be built according to the following considerations. Let the network nodes be numbered from 1 to N, and let the multicast sessions be numbered from 1 to K. For $1 \leq k \leq K$ let $s_k$ be the source node of session k, and let $R_k \subseteq \{1, \ldots, N\} \backslash s_k$ be the set of destination nodes. The goal is to maximize throughput subject to a fairness constraint. In this embodiment of method 10, the fairness constraint can be expressed most easily by assuming that each session has a finite number $d_k$ of bits to be transmitted. The controller 16 uses linear programming to find a transmission schedule to satisfy these demands in the minimum amount of time. This is equivalent to assuming that each session has a desired rate of $d_k$ bits per second, and we wish to find the largest $\lambda$ such that, for each session k, at least $\lambda d_k$ bits per second can be sent. A linear programming algorithm may realize the target maximization, but its solution, while guaranteeing that each receiving node is allocated $\lambda d_k$ bits per second, can easily be allocated a longer session. But erasure coding may be used so that each destination node can receive a segment of its allocated transmission and recover the message from that segment.

A set of sessions that can be active at the same time will be called an operating mode. The controller 16 may build the transmission schedule by assigning a duration to each possible operating mode. We will represent an operating mode with a set $S \subseteq \{1, \ldots, K\}$ such that $|S| \leq F$ and all sessions in S have different source nodes. Strictly speaking, an operating mode should also assign each of these sessions to a channel; this information is needed to execute the schedule. However, there is no advantage to using different channel assignments for the same set of sessions, so we will assume there is a convention that determines the channel assignment for each operating mode. The convention is not needed while building the schedule. Let the operating modes be numbered from 1 to M. A schedule will be an M-by-1 vector T whose ith component is $T_i$, the time spent in the ith operating mode. A schedule is feasible if for each session, every destination node can receive the whole message.

For any pair (k,j) such that $k \in \{1, \ldots, K\}$ and $j \in R_k$, let $L_{kj}$ the amount of time that node j listens to session k. This will occur during all operating modes such that node $s_k$ is transmitting session k and node j is not transmitting. Let $J = \Sigma_{k=1}^{K} |R_k|$; then there are J such pairs (k,j), and we number them from 1 to J. If (k,j) is the ith pair, then $L_{kj}$ will also be called $L_i$. Let A be the J-by-M matrix such that entry (i, m) is 1 if node j listens to session k during operating mode m, and 0 otherwise. Let B be the K-by-M matrix such that entry (k, m) is 1 if session k is included in operating mode m, and 0 otherwise. Let L=AT; then L is a J-by-1 vector whose ith component is $L_i$. The number of bits that node j receives during time $L_{kj}$ is $cL_{kj}$, which must be at least $d_k$ to satisfy the demand, so let d be a J-by-1 vector whose ith component is $d_k$. Therefore, any feasible schedule must satisfy the following constraint:

$$AT \geq d/c \qquad (1)$$

Constraint (1) is necessary for a schedule to satisfy the demands; now we will show that it is sufficient. Let X=BT; then X is a K-by-1 vector; let $X_k$ be its kth entry. $X_k$ is the total transmission time of session k, because it is the sum of $T_i$ over all modes that include session k. So the number of bits transmitted is for session k is $cX_k$. Note that $cX_k$ is not necessarily an integer. Theoretically this is not a problem, because information is not necessarily sent in the form of bits. For example, it could be sent as ternary symbols, each of which carries log 3/log 2 bits of information. In practice, $cT_i$ will probably have to be an integer for each operating mode i. Furthermore, $T_i$ may have to be a multiple of some pre-determined time slot width. So the optimum that we will compute is an approximation of the true optimum, and the relative error approaches 0 for large values of the $d_k$'s. For any $j \in R_k$, by definition $X_k \geq L_{kj}$. If node j sometimes transmits at the same time that node $s_k$ transmits session k, then $L_{kj}$ will be less than $X_k$, which implies $cX_k > cL_{kj} \geq d_k$. So the number of bits transmitted for session k is more than the length of the message.

To resolve this discrepancy, the controller 16 uses erasure code such as that disclosed in the 1960 paper Polynomial codes Over Certain Finite Fields, J. Soc. Indust. Appl. Math, Vol. 8, pp. 300-304 by I. S. Reed and G. Solomon, which is incorporated by reference herein. For any positive integers a, b, and m with $a<b<2^m$, there is a (b, a) erasure code using $2^m$-ary symbols (i.e. each symbol is formed from m bits.) This code maps a information symbols to a b-symbol codeword, and this code can correct b-a erasures. This means that if the b symbols are sent through the channel, then any receiver that receives at least a of them can decode the original information symbols. Since our channel rate is c bits per second, the transmitter sends am bits of information in bm/c seconds, but the receiver only needs to listen for am/c seconds to decode the am bits. In effect, the transmitter sends information at ca/b bits per second, and the receiver receives it c bits per second. Thus, for any t>0 and any 0<r<1, a transmitter node may send crt bits of information in t seconds, encoded in such a way that a listener node may receive the information by listening during any rt seconds of the transmission.

Accordingly, constraint (1) may be sufficient to satisfy the demands, provided that session k is transmitted at code rate:

$$r_k = \frac{d_k}{cX_k}$$

So, in this embodiment, the time needed to send all sessions is the minimum of $\Sigma_{i=1}^M T_i$ subject to $T_i \geq 0$ and constraint (1). This is an LP problem: let c be the M-by-1 vector consisting of ones; then our problem may be stated as $$\text{Minimize } c^T T \text{ subject to } AT \geq \frac{d}{c} \text{ and } T \geq 0.$$

The number of variables is $O(K^F)$ and the number of constraints is O(KN), so for fixed F the problem can be solved in polynomial time. Let T* be the minimum value of $c^T T$.

The following is an example embodiment of method 10 implemented on a network of 12 nodes N and three channels F, and each node has a demand to send d bits to all other nodes. There are 10·9·8/6=120 operating modes that use all three frequencies. The optimal schedule assigns equal time T to each of these 120 modes. For any nodes j and k, there are 8·7/2=28 operating modes in which node j listens to node k. So $28T=L_{kj}=d/c$;

$$120T = \frac{120}{28}\frac{d}{c} \approx 4.29\frac{d}{c}.$$

and the total time needed is $$T = \frac{1}{28}\frac{d}{c};$$

Each node transmits in 9·8/2=36 operating modes, so the code rate is 28/36=7/9. In contrast, suppose we did not use erasure coding. Then if two nodes transmit at the same time, each would miss part of the other's message, and the demand would not be satisfied. So the time needed to satisfy the demands without erase coding is $$10\frac{d}{c}.$$

An embodiment of method 10 includes the requirement that each transmission contains an integral number of bits, and comprises the step of converting the LP solution to an explicit schedule. In this embodiment, after the controller 16 solves the LP problem, the controller 16 then decides when to use each operating mode, and chooses an encoding method that will allow each destination node to decode the messages. The total duration of the implemented schedule should be close to T*, with the relative error approaching 0 for large values of the $d_k$'s. We will describe an algorithm to do this. Part of the algorithm must be executed before communication begins, and the results must be available to all nodes. The rest of the algorithm must be executed at all nodes, and we will make this part deterministic so all nodes agree on a schedule. We will use an erasure code for each session. All codes will use m bits per symbol for some m to be determined. We would like to place a bound on m in order to limit the complexity of encoding and decoding. However, achieving near-optimal throughput with a bound on m is difficult, and may not be possible in all cases. We will prove the following: Theorem 1: Suppose the following data is specified: N, K, F, and for $1 \leq k \leq K$, $s_k$ and $R_k$ (but not $d_k$). Then for any $\varepsilon > 0$ there is a $\Delta_0$ such that for any $d_1, \ldots, d_K$ with $\Sigma_{k=1}^K d_k \geq \Delta_0$ there is an m such that the algorithm below yields a schedule with total duration<$(1+\varepsilon)T^*$ where T* is the optimal value of the LP problem.

Let $d'=\lceil d/m\rceil$; then if (j, k) is the ith pair, the ith component $d'_i$ is the number of symbols in session k. For $1\leq i\leq M$ let $T_i$ be the optimal time computed for the ith operating mode, and let $$Q_i = \left\lceil \frac{cT_i}{m} \right\rceil.$$

The ith operating mode will be used for $Q_i$ symbols. Let Q be the M-by-1 vector with components $Q_i$, and let L'=AQ. If (j, k) is the ith pair, recall that the ith row of A indicates during which modes node j receives session k; therefore the ith component of L' is the number of symbols that node j receives of session k. Call this component $L'_{kj}$ or $L'_i$. Then $$L' = A\left\lceil \frac{cT}{m} \right\rceil \geq \text{(by eq. 1)} \lceil d/m \rceil = d'.$$

So $L'_{kj} \geq d'_k$ as required.

Let $X'_k$ be the sum of $Q_i$ over all operating modes that include session k; then $X'_k$ is the kth element of BQ and is the number of symbols transmitted for session k. For each k we need to choose a (b, a) erasure code such that $a\leq b\leq 2^m-1$. (The case a=b represents uncoded transmission.) We must ensure that each destination node receives at least a symbols of every codeword. The simplest solution is to choose $a=d'_k$ and $b=X'_k$, making the entire message a single codeword. This requires choosing m so that $2^m>X'_k$, which is possible because $X'_k$ is a non-increasing function of m.

The data needed to execute the schedule consists of m, $Q_i$ for $1\leq i\leq M$, and $d'_k$ and $X'_k$ for $1\leq k\leq K$. For each session, the source node encodes the $d'_k$-symbol message to $X'_k$ symbols. The transmission then proceeds in M steps; during step i, $Q_i$ symbols are transmitted for each of the sessions included in operating mode i. For each session k, each destination node $j \in R_k$ keeps track of the number of symbols transmitted for session k; if node j transmits during a mode that includes session k, then node j records erasures in place of the missed symbols. After all modes have been executed, each message can be decoded by all of its destination nodes. Theorem 1 is a special case of Theorem 1a below.

In the following example embodiment of method 10, the controller 16 modifies the transmission schedule to reduce latency and to accommodate time slots of a pre-determined duration. Suppose that our schedule is required to use time slots of a fixed duration $\beta_0/c$ that can each accommodate $\beta_0$ channel bits. We want an algorithm to construct a schedule so that Theorem 1 is still satisfied. In general $\beta_0$ will not be a multiple of m, which means a time slot cannot be filled by complete symbols. Recall that m is a number to be chosen. We can try to find a suitable m that is a divisor of $b_0$, but to prove Theorem 1 we need to allow m to be larger than N. After packing $\lfloor \beta_0/m \rfloor$ symbols into a time slot, we can either leave the rest of the slot unused, or split the next symbol across two slots (or more than two, if $m>2\beta_0$). The first option is not acceptable because it wastes a fraction of the capacity, and this fraction does not decrease as the $d_k$'s increase, so Theorem 1 is not satisfied. So we can split symbols. Also, it is not useful to change operating modes in mid-symbol, because erasure decoding cannot make use of a partial symbol. So in effect we are constrained to use time slots of size 1 cm($\beta_0$, m). It is difficult to prove inequalities involving 1 cm($\beta_0$, m) due to its non-monotonic nature, so we will allow the use of even larger time slots. The algorithm will choose a β and an m such that β is a multiple of 1 cm($\beta_0$, m), and m satisfies an additional constraint that will be described later. Let a=β/m. The algorithm will use m-bit symbols grouped into time slots of a symbols each, and will only change operating modes at time slot boundaries. In the description of the algorithm, "time slot" will always mean a duration β/c, not $\beta_0$/c.

Let γ be an integer>1. To reduce latency, we will divide each message k into γ submessages of $d_k/\gamma$ bits each, and we will construct the algorithm so that the each destination node can decode the ith submessage after a fraction i/γ of the schedule duration. We will prove the following:

Theorem 1a: Suppose the following data is specified: N, K, F, $\beta_0$, γ, and for $1\leq k\leq K$, $s_k$ and $R_k$ (but not $d_k$). Then for any ε>0 there is a $\Delta_0$ such that for any $d_1, \ldots, d_K$ with $\Sigma_{k=1}^{K} d_k \geq \Delta_0$ there is an m and α such that mα is a multiple of $\beta_0$ and the algorithm below yields a schedule with total duration<(1+ε)T* where T* is the optimal value of the LP problem.

Let $d'=\lceil d/m\rceil$; then if (j, k) is the ith pair, the ith component $d'_i$ is the number of symbols in session k. Let β=mα. For $1\leq k\leq K$ let $d''_k=\lceil d_k(\beta\gamma)\rceil$. For $1\leq i\leq M$ let $T_i$ be the optimal time computed for the ith operating mode, and let $$Q_i = \left\lceil \frac{cT_i}{m\alpha\gamma} \right\rceil.$$

The ith operating mode will be used for $\gamma Q_i$ time slots. Let Q be the M-by-1 vector with components $Q_i$, and let L'=AQ. If (j, k) is the ith pair, recall that the ith row of A indicates during which modes node j receives session k. Let the ith component of L' be called $L'_{kj}$ or $L'_i$. Then $\gamma L'_{kj}$ is the number of time slots that node j receives of message k. The number of symbols received in $\gamma L'_{kj}$ time slots is the ith component of $$\alpha\gamma L' = \alpha\gamma A\left\lceil \frac{cT}{m\alpha\gamma} \right\rceil \geq A\left\lceil \frac{cT}{m} \right\rceil \geq \text{(by eq. 1)} \lceil d/m \rceil = d'$$

indicating that node j receives enough symbols to decode session k. Also $$L' = A\left\lceil \frac{cT}{m\alpha\gamma} \right\rceil = A\left\lceil \frac{cT}{\beta\gamma} \right\rceil \geq \text{(by eq. 1)} \left\lceil \frac{d}{\beta\gamma} \right\rceil.$$

The ith component of $$\left\lceil \frac{d}{\beta\gamma} \right\rceil$$

is $d''_k$, so $d''_k \leq L'_i = L'_{kj}$.

For each k, let $X'_k$ be the kth component of BQ, which is the sum of $Q_i$ over all operating modes that include session k; then $\gamma X'_k$ is the number of time slots transmitted for message k, and $\alpha\gamma X'_k$ is the number of symbols transmitted for message k. For each k we need to choose a (b, a) erasure code such that $a\leq b\leq 2^m-1$. We may ensure that each destination node receives at least a symbols of every codeword. We will choose $a=d''_k$ and $b=X'_k$. This requires choosing m so that $2^m>X'_k$. Note that $X'_k$ is a nonincreasing function of mα, and that both m and α can be chosen so that mα is a multiple of $\beta_0$. One possibility is to choose $\alpha=\beta_0$; then $2^m>X'_k$ will be satisfied for sufficiently large m. The choice of $\alpha=\beta_0$ is not necessarily the best choice, and is presented only to make it easier to prove Theorem 1 a. The scheduling algorithm will work for any m and $\alpha$ such that $m\alpha$ is a multiple of $\beta_0$ and $2^m>X'_k$.

In this embodiment, the data needed to execute the schedule consists of m, $\alpha$, $\gamma$, $Q_i$ for $1\le i\le M'$, and $d''_k$ and $X'_k$ for $1\le k\le K$. Each source node must pad message k to the length $\gamma\alpha md''_k$ bits. The schedule consists of $\gamma$ phases. We describe the first phase: For each session, the source node divides the first $\alpha d''_k$ symbols of message k into a groups of $d''_k$ each. It then encodes each group to form an $X'_k$-symbol codeword. The controller then allows the transmission to proceed for $\Sigma_{i=1}^{M} Q_i$ time slots, with each operating mode i used for $Q_i$ of these time slots. In each time slot, the current operating mode determines which messages are transmitted. For each such message, the source node transmits the next symbol from each of its $\alpha$ codewords. For each session k, each destination node $j\in R_k$ keeps track of the number of symbols transmitted for session k; if node j transmits during a mode that includes session k, then node j records erasures in place of the missed symbols. After all $\Sigma_{i=1}^{M} Q_i$ time slots, each source node has sent $X'_k$ symbols of each codeword of message k (i.e. all of them), and each destination node $j\in R_k$ has received $L'_{kj}$ symbols from each codeword in message k. Since $L'_{kj}\ge d''_k$, the destination node decodes all $\alpha$ codewords. Each remaining phase transmits the next $\alpha d''_k$ symbols of message k in the same way. After all $\gamma$ phases, $\gamma\alpha md''_k$ bits of each message have been encoded, sent, and decoded by all destination nodes. Since $\gamma\alpha md''_k\ge d_k$, we are done.

The following is a proof of Theorem 1a.

Given N, K, F, $\beta_0$, $\gamma$, $s_k$ and $R_k$ for $1\le k\le K$, and $\epsilon>0$, let M be the number of possible operating modes. It is well known that an increasing exponential function eventually dominates a polynomial function, so we can find a z such that $$\text{for any } x \ge z, 2^x \ge \left(2\left(M + \frac{x}{\gamma\beta_0}\right)\right)^{\frac{FM\gamma\beta_0}{\epsilon}}.$$

Choose $\Delta_0=\lceil z\rceil$. Then for any $d_1,\ldots,d_K$ with $\Sigma_{k=1}^{K} d_k\ge\Delta_0$, let $\Delta=\Sigma_{k=1}^{K} d_k$, choose $$m = \left\lceil \log_2\left(M + \frac{\Delta}{\gamma\beta_0}\right)\right\rceil,$$

and choose $\alpha=b_0$. Recall that m is required to satisfy $2^m>X'_k$ for $1\le k\le K$, and each $X'_k$ depends on m. We will prove that these constraints are satisfied. We now compute some inequalities.

Assertion 1:

$$2^m > M + \frac{\Delta}{\gamma\beta_0}.$$

This is immediate from the definition of m.

Assertion 2:

$$\sum_{i=1}^{M} Q_i < M + \frac{cT^*}{m\alpha\gamma}.$$

Recall that by definition $$Q_i = \left\lceil \frac{cT_i}{m\alpha\gamma}\right\rceil \text{ and } T^* = \sum_{i=1}^{M} T_i.$$

So $$\sum_{i=1}^{M} Q_i < \sum_{i=1}^{M}\left(1 + \frac{cT_i}{m\alpha\gamma}\right) = M + \frac{c}{m\alpha\gamma}\sum_{i=1}^{M} T_i = M + \frac{cT^*}{m\alpha\gamma},$$

proving Assertion 2.

Assertion 3:

$$T^* \le \frac{\Delta}{c}.$$

Recall that $\Delta$ is the total number of bits to be sent. They could be sent in time $$\frac{\Delta}{c}$$

by sending them uncoded sequentially on a single channel, so the optimal duration can be no larger.

Assertion 4:

$$T^* \ge \frac{\Delta}{cF}\cdot cF$$

is the total capacity of the F channels, so the time needed to send $\Delta$ bits is at least $$\frac{\Delta}{cF}.$$

Assertion 5: For $1\le k\le K$, $2^m>X'_k$. Recall that by definition $\gamma X'_k$ is the number of time slots transmitted for message k, and $\gamma Q_i$ is the number of time slots for spent in the ith operating mode. So $\alpha\gamma\Sigma_{i=1}^{M} Q_i$ is the number of symbol durations in the schedule. Therefore $$X'_k \le \sum_{i=1}^{M} Q_i < \text{(by Assertion 2)} M + \frac{cT^*}{\gamma m\alpha} \le$$

$$M + \frac{cT^*}{\gamma\beta_0} \le \text{(by Assertion 3)} M + \frac{\Delta}{\gamma\beta_0} < \text{(by Assertion 1)} 2^m,$$

proving Assertion 5.

Assertion 6:

$$\Delta \geq \frac{FM\gamma\beta_0 m}{\varepsilon}.$$

Since $\Delta \geq z$, we have $$2^\Delta \geq \left(2\left(M + \frac{\Delta}{\gamma\beta_0}\right)\right)^{\frac{FM\gamma\beta_0}{\varepsilon}}.$$

Taking base-2 logarithms of both sides, we get $$\Delta \geq \frac{FM\gamma\beta_0}{\varepsilon} \log_2\left(2\left(M + \frac{\Delta}{\gamma\beta_0}\right)\right) =$$
$$\frac{FM\gamma\beta_0}{\varepsilon}\left(1 + \log_2\left(M + \frac{\Delta}{\gamma\beta_0}\right)\right) \geq \frac{FM\gamma\beta_0}{\varepsilon}\left\lceil \log_2\left(M + \frac{\Delta}{\gamma\beta_0}\right)\right\rceil = \frac{FM\gamma\beta_0}{\varepsilon}m,$$

proving Assertion 6.
Now we can complete the proof. The total schedule duration is $$\frac{m\alpha\gamma}{c}\sum_{i=1}^{M} Q_i < \text{(by Assertion 2)} \frac{Mm\alpha\gamma}{c} + T^* = \frac{FMm\gamma\beta_0}{\varepsilon}\frac{\varepsilon}{cF} + T^* \leq$$
$$\text{(by Assertion 6)}\Delta\frac{\varepsilon}{cF} + T^* \leq \text{(by Assertion 4)}\varepsilon T^* + T^*$$

as required.

In the description above, we see that by increasing α or γ, we can reduce both m, the number of bits per symbol, and b, the number of symbols per codeword, but this reduction is limited: the algorithm specifies $b_k = X'_k$, and $X'_k$ must be at least the number of operating modes used in message k. The reason for the choice $b_k = X'_k$ is that it allows each codeword to be spread across all operating modes used in the message, and this is a convenient way to ensure that each destination node receives enough symbols of every codeword.

In some cases this can be accomplished with shorter codewords. For example, recall the example embodiment described above where N=10, F=3, and each node has d bits to send to all other nodes. 36 operating modes are used for each message, for equal numbers of bits, and each destination node listens to 28 of these 36. If we can split these 36 into four subsets of nine each, so that each destination node listens to seven from each subset, then we can use codewords of length nine, each spread across the operating modes of one subset. Such a splitting is possible. For $1 \leq q \leq 4$, let $S_q = \{(i,j,10) \in \{1, \ldots, 9\} \times \{1, \ldots, 9\} \times \{10\} | j-i \equiv q \mod 9\}$. These are four disjoint sets of nine modes each, and their union is the set of modes used in the tenth message. By permuting $\{1, \ldots, 10\}$ we get splittings for the other messages.

In the general case, different destination nodes will listen to different numbers of operating modes, and these operating modes will be used for different lengths of time. $X'_k$ could be a prime number for some choices of m, α, and γ. Therefore we cannot describe a splitting method that works in the general case. It is possible to use codewords of different lengths and rates for the same message. However, recall that the optimal code rate for each message is determined by the optimal solution to the LP problem, so in order to keep the schedule duration close to T*, the code rates must stay close to the optimal rates. Also, if we are required to use an $m \leq m_{max}$, then all of our code rates must have a denominator $< 2^{m_{max}}$. For very small values of ε, not all possible rates will be within ε of a fraction with denominator $< 2^{m_{max}}$. It may be possible to prove that if m is bounded, no schedule of the type we have considered can satisfy Theorem 1.

From the above description of the Method for Increasing Multicast Throughput in a Single-Hop Multi-Channel Wireless Network, it is manifest that various techniques may be used for implementing the concepts of method 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that method 10 is not limited to the particular embodiments described herein, but is capable of many embodiments without departing from the scope of the claims.

We claim:

1. A communications method comprising the following steps:
    establishing a single-hop, multi-channel wireless network comprising a plurality of half-duplex nodes that can simultaneously receive on multiple channels but that cannot simultaneously transmit on the multiple channels;
    establishing a linearly programmed rapid-throughput transmission schedule for data transmissions between the half-duplex nodes;
    multicasting all the data transmissions in the network in multicast sessions according to the transmission schedule; and
    reconstructing data transmitted in a particular multicast session by performing erasure coding in instances where the entirety of the particular multicast session is not received at a given node because the given node was transmitting during part of the particular multicast session,
    wherein the transmission schedule allows different multicast sessions originating from different nodes to overlap in time, and wherein the transmission schedule allows any transmitting node to send crt bits of data in a multicast session k, where c is a number of bits per second received at a receiving node, t is a time required to transmit the crt bits of data in seconds that is greater than 0, and r is a variable that is greater than 0 and less than 1, and wherein the crt bits of data are encoded via erasure coding such that a receiving node need only receive rt seconds worth of the multicast session k to recover the entire crt bits of data.

2. The method of claim 1, wherein a set of multicast sessions operating together is labeled an operating mode, and wherein the sets of multicast sessions operating together are numbered from 1 to M.

3. The method of claim 2, wherein the transmission schedule is an M-by-1 vector T having a component $T_i$ that represents time spent in an ith operating mode.

4. The method of claim 3, wherein the transmission schedule must satisfy the expressions $AT \geq d/c$ and $T \geq 0$, where c represents a number of bits per second received at a receiving node, d is a J-by-1 vector wherein J represents the number of pairs in the network of a multicast session and an intended recipient of that session, d indicates the number of bits of each session to be received by each recipient, and A is a J-by-M 0/1-matrix with 1's indicating which multicast sessions reach each recipient during each operating mode.

5. The method of claim 1, further comprising the step of transmitting session k from a transmitting node at a rate of $d_k/cX_k$ where $d_k$ represents a number of bits to be transmitted and $X_k$ is the total transmission time of session k.

6. The method of claim 5, wherein establishing linear the linearly programmed transmission schedule comprises solving the following problem: Minimize $C^T T$ subject to $$AT \geq \frac{d}{c}$$

and T≥0.

7. The method of claim 1, wherein all nodes are within communication range of each other.

8. The method of claim 7, wherein all transmissions are transmitted at the same rate.

9. The method of claim 1, wherein each multicast session is only transmitted once from a single node and is not retransmitted or relayed by other nodes.

10. The method of claim 1, wherein the rapid-throughput transmission schedule is established in polynomial time.

11. The method of claim 1, wherein the transmission schedule requires different multicast sessions originating from different nodes to overlap in time.

12. The method of claim 2, wherein the erasure coding comprises a codeword for each multicast session, and wherein each codeword is spread across all operating modes used in the multicast session such that each destination node receives enough symbols of every codeword to reconstruct the multicast session.

13. A single-hop, multi-channel wireless network comprising:

a plurality of half-duplex nodes all positioned within communication range of each other, wherein the nodes are positioned and connected such that they can simultaneously receive multicast sessions on multiple channels, and wherein the nodes cannot simultaneously transmit on multiple channels;

a processor operatively coupled to the nodes and configured to establish a linearly programmed rapid-throughput transmission schedule for data transmissions between the half-duplex nodes such that all data transmissions between the nodes are conducted according to the transmission schedule; and wherein each node is configured to reconstruct data transmitted in a particular multicast session by performing erasure coding in instances where the entirety of the particular multicast session is not received at a given node because the given node was transmitting during the particular multicast session, wherein the transmission schedule allows different multicast sessions originating from different nodes to overlap in time, and wherein the transmission schedule allows any transmitting node to send crt bits of data in a multicast session k, where c is a number of bits per second received at a receiving node, t is a time required to transmit the crt bits of data in seconds that is greater than 0, and r is a variable that is greater than 0 and less than 1, and wherein the crt bits of data are encoded via erasure coding such that a receiving node need only receive rt seconds worth of the multicast session k to recover the entire crt bits of data.

14. The wireless network of claim 13, wherein the nodes are configured to transmit data at the same rate.

15. The wireless network of claim 13, wherein each multicast session is only transmitted once from a single node and is not retransmitted or relayed by other nodes.

16. The wireless network of claim 13, wherein the transmission schedule requires different multicast sessions originating from different nodes to overlap in time.

* * * * *